United States Patent [19]
Kiyono et al.

[11] Patent Number: 5,352,916
[45] Date of Patent: Oct. 4, 1994

[54] FULLY CMOS-TYPE SRAM DEVICE WITH GROUNDING WIRE HAVING CONTACT HOLES

[75] Inventors: Junji Kiyono; Yasushi Yamazaki, both of Tokyo, Japan

[73] Assignee: NEC Corporation, Tokyo, Japan

[21] Appl. No.: 936,336

[22] Filed: Aug. 28, 1992

[30] Foreign Application Priority Data

Aug. 30, 1991 [JP] Japan .................................. 244856

[51] Int. Cl.[5] .................................................. H01L 27/04
[52] U.S. Cl. ...................................... 257/393; 257/69; 257/660; 257/903
[58] Field of Search ............... 257/903, 904, 659, 660, 257/69, 71, 393; 365/154, 156

[56] References Cited

U.S. PATENT DOCUMENTS 4,980,732 12/1990 Okazawa ............................ 257/903
5,132,771 7/1992 Yamanaka et al. ................. 257/903

FOREIGN PATENT DOCUMENTS 1-166554 6/1989 Japan .
1-202858 8/1989 Japan .

OTHER PUBLICATIONS

"A Memory Cell with Polysilicon Thin Film Transistor (TFT) for a 4Mbit SRAM", by K. Tsutsuei et al., "Singaku Giho", (SDM90-25), vol. 90, No. 48, pp. 7–13.

*Primary Examiner*—Robert Limanek
*Attorney, Agent, or Firm*—Burns, Doane, Swecker & Mathis

[57] ABSTRACT

A grounding wiring layer is provided on the substantially entire region between driver MOS transistors and load MOS thin film transistors of a flip-flop type memory cell. The contact holes for connecting the gate electrodes of the MOS thin film transistors with storage nodes are formed by providing a side wall on the inner wall of each of the contact hole portions formed in the grounding wiring layer and inter-layer insulating films sandwiching it. Thus, the impedance of the grounding wiring layer can be reduced to stabilize the operation of a miniaturized SRAM memory cell using the load MOS thin film transistors. The resistance against soft error caused by α-ray can also be improved.

2 Claims, 4 Drawing Sheets

FULLY CMOS-TYPE SRAM DEVICE WITH GROUNDING WIRE HAVING CONTACT HOLES

BACKGROUND OF THE INVENTION (1) Field of the Invention

The present invention relates to a CMOS-type SRAM device and a method for fabricating the same, and more particularly to a fully CMOS-type SRAM device in which load transistors of a flip-flop memory cell are constructed by p-channel thin-film MOS transistors and a method for fabricating the same.

(2) Description of the Related Art

The memory cell structure of a fully CMOS-type SRAM device is disclosed in, e.g., "SINGAKU GIHO" Vol. 90, No. 48, pp. 7-13 (SDM90-25), JP-A-1-166554, and JP-A-1-202858. Its typical example will be explained with reference to FIGS. 1A, 1B and FIG. 2. FIGS. 1A and 1B are plan views of a fully CMOS-type SRAM which has as load elements bottom-gate type p-channel MOS thin film transistor (hereinafter simply referred to as "p-TFTs"). FIG. 2 is a sectional view taken along the line A—A in FIG. 1A.

This prior art SRAM has four thin film conductor layers and one Al (aluminum) interconnect wiring layer stacked on a semiconductor substrate. Specifically, these layers are, from the lowest layer, a gate electrode of a driver MOS transistor; a grounding (GND) wiring connected with the source of the driver MOS transistor; a bottom gate electrode of the p-TFT; a source, drain, channel of the p-TFT and a power supply line; and a bit line.

Hereunder, the structure of the above prior art SRAM device will be explained more specifically.

The driver MOS transistors of a flip-flop circuit are composed of an n+-impurity-doped region (hereinafter referred to an impurity region) 1f serving as a common source, n+-impurity regions 1e, 1d constituting drains, and gate electrodes 3b, 3c. The gate electrodes 3b and 3c are cross-connected, through contact holes 2b and 2c, with the impurity regions 1e and 1d, respectively, which serve as the drains of paired transistors for each other.

The n-channel transfer MOS transistors connected with the flip-flop are composed of n+-impurity regions 1c, 1e serving as sources, n+-impurity regions 1a, 1b serving as drains, and a common gate electrode 3a serving as a word line. The impurity region 1d also constitutes the drain of the driver MOS transistor. The impurity region 1c is connected with the n+-impurity region 1e constituting tile drain of the driver transistor through the contact holes 2a, 2c and the gate electrode 3b. These impurity regions 1e, 1d and the gate electrodes and impurity regions connected with them constitute storage nodes.

The above n+-impurity regions 1a and 1b are connected with bit lines 17a and 17b which are Al interconnect wirings through contact holes 16a and 16b, respectively. The n+-impurity region 1f constituting the common source of the driver MOS transistors is connected, through a contact hole 4, with a grounding (GND) wiring layer which is formed by the second layer wiring.

The load elements which are bottom gate type TFTs are composed of gate electrodes 7a and 7b which are connected with the gate electrodes 3b and 3c of the driver MOS transistors through the contact holes 6a' and 6b', respectively, and semiconductor thin films 9a and 9b which are formed on them through a gate insulating film 8.

The semiconductor thin films 9a and 9b form drain regions 10a, 10b, source regions 12a, 12b, channel regions 14a, 14b and offset regions 15a, 15b of the TFTs, and also form power supply wiring layers 13a, 13b for supplying power to the memory cell.

The drain regions 10a and 10b of the TFTs are connected with the gate electrodes 7a and 7b through contact holes 11a and 11b, respectively, and constitute storage nodes together with the gate electrodes 7a and 7b, the gate electrodes 3b and 3c of the driver MOS transistors and the impurity regions 1c through 1d. The source regions 12a and 12b of the TFTs are connected with the power supply wiring layers 13a and 13b, respectively. Further, in order to improve the cut-off characteristics of the TFT, i.e., to reduce the off currents, the offset regions 15a and 15b doped with no impurity are provided between the channel regions 14a, 14b and the drain regions 10a, 10b, respectively.

The prior art described above has the following problem to be solved. In order to ensure or enhance the stability of the CMOS-type SRAM cell, it is important to supply the grounding potential to a flip-flop with a low Impedance. Where it is attempted to realize a minute cell size, the conventional cell structure cannot permit a large width of the grounding wiring layer 5 because of the limitation of layout, which makes it difficult to provide the grounding line with a low impedance. Namely, in the conventional cell structure, the width of the grounding wiring layer is determined by the positions of the contact holes 6a' and 6b' between which a margin should be left. Therefore, the width of the grounding wiring layer cannot be enlarged.

It is known that the off current of the load TFT is greatly affected by the electric field strength at the drain edge of the TFT. However, the conventional cell structure has the following structural problems. Namely, in the conventional cell structure, the gate electrodes 3b and 3c of the driver MOS transistors are located below the offset regions 15a and 15b of the TFTs. For this reason, the potential of the underlying gate electrode generates a change in the electric strength field for the drain of the TFT, which makes the off current characteristic unstable.

Further, in order to enhance the α-ray resistance characteristic of a memory cell, it is necessary to provide a storage node with sufficient capacitance. In the conventional cell structure, however, the capacitance of the storage node with respect to the grounding wiring layer cannot be made large because of the above limitation in the layout of the grounding wiring layer. These are problems to be solved by the invention, in the conventional cell structure.

SUMMARY OF THE INVENTION

It is, therefore, an object of the invention to provide a CMOS-type SRAM cell with a stable operation.

It is another object of the invention to provide a CMOS-type SRAM cell with an improved α-ray resistance strength.

According to one aspect of the invention, there is provided a fully CMOS-type static random access memory device comprising:

MOS transistors of a first conductivity type constituting driver transistors of a flip-flop type memory cell, formed on a main surface of a semiconductor substrate;

MOS thin film transistors of a second conductivity type constituting load transistors of the flip-flop memory cell, formed on the main surface of the semiconductor substrate; and a conductive thin film extending between the MOS transistors and the MOS thin film transistors, the conductive film being connected with a fixed potential power source and having holes opened in its contact hole portions for connecting the MOS transistors with the MOS thin film transistors.

According to another aspect of the invention, there is also provided a method for fabricating a fully CMOS-type static random access memory, comprising the steps of:

forming MOS transistors of a first conductivity type on a main surface of a semiconductor substrate, the MOS transistors constituting driver transistors of a flip-flop type memory cell;

forming, on the MOS transistors, a first insulating film, a conductive thin film, and a second insulating film;

selectively etching the first insulating film, the conductive thin film and the second insulating film to form contact hole portions for exposing surfaces of storage nodes of the flip-flop type memory cell;

forming a side wall made of insulator on an inner wall of each of the contact hole portions to form contact holes on the storage nodes; and forming MOS thin film transistors of a second conductivity type constituting load transistors of the flip-flop type memory cell, connected with the storage nodes through the contact holes, respectively.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Figure 1A:
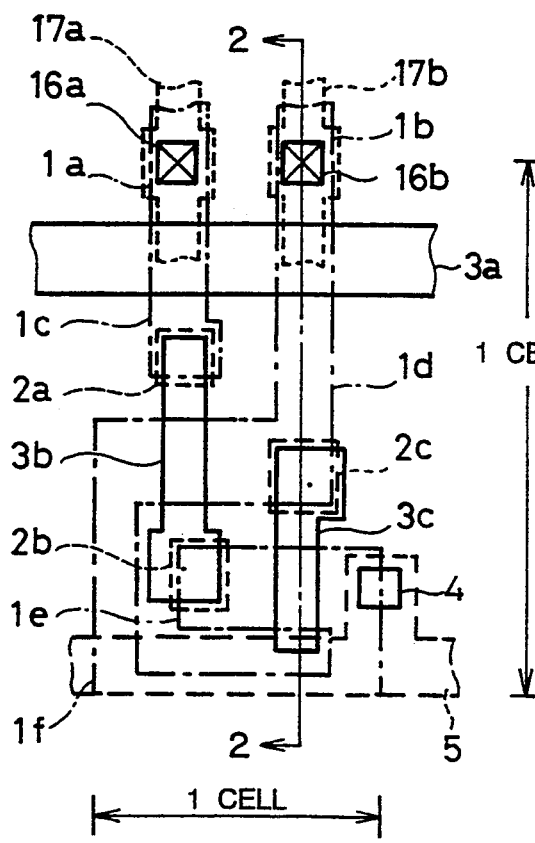
FIGS. 1A and 1B are plan views of a typical example of the prior art fully CMOS-type SRAM cell structure.
Figure 1B:
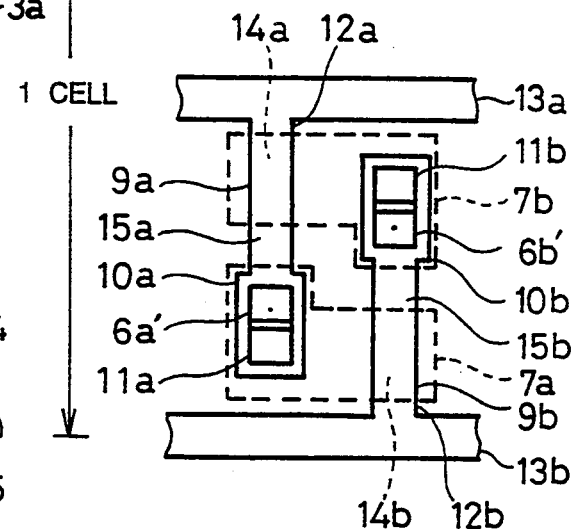
Figure 2:
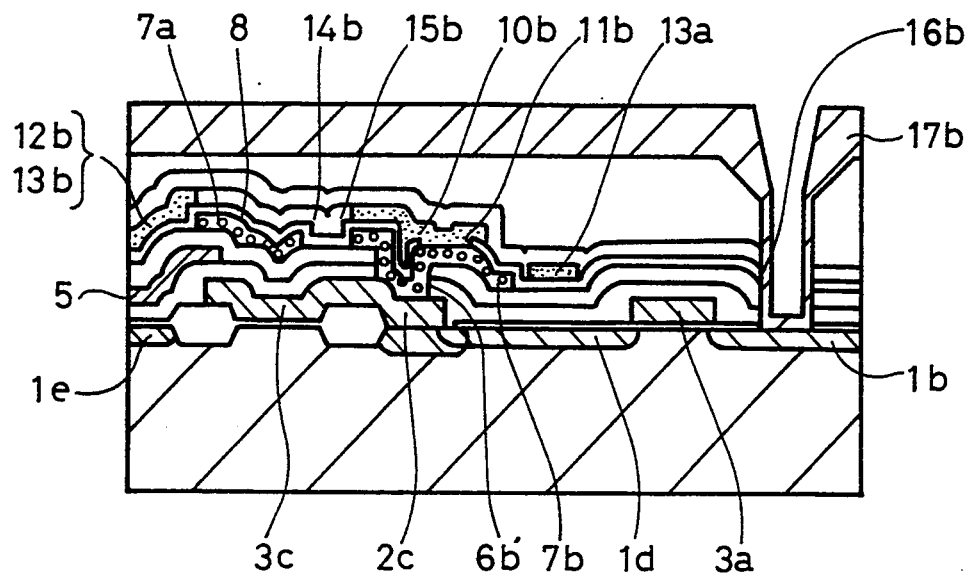
FIG. 2 is a sectional view taken along an A—A line in FIG. 1A.

Now, preferred embodiments of the present invention will be explained with reference to the accompanying drawings. Throughout the following explanation, the same or like reference numerals refer to the same or like elements in all the figures of the drawings.

First Embodiment

Figure 3A:
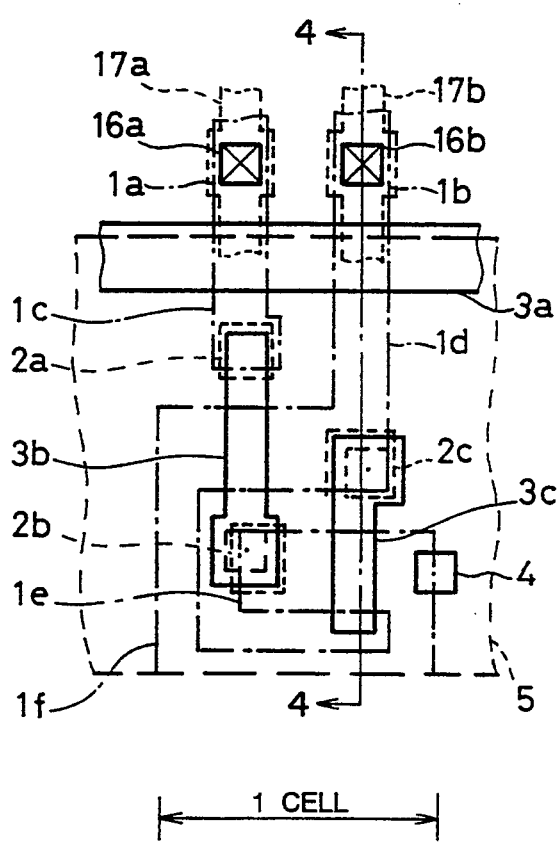
FIGS. 3A and 3B are plan views of a memory cell structure of a fully CMOS-type SRAM of a first embodiment according to the present invention.
Figure 3B:
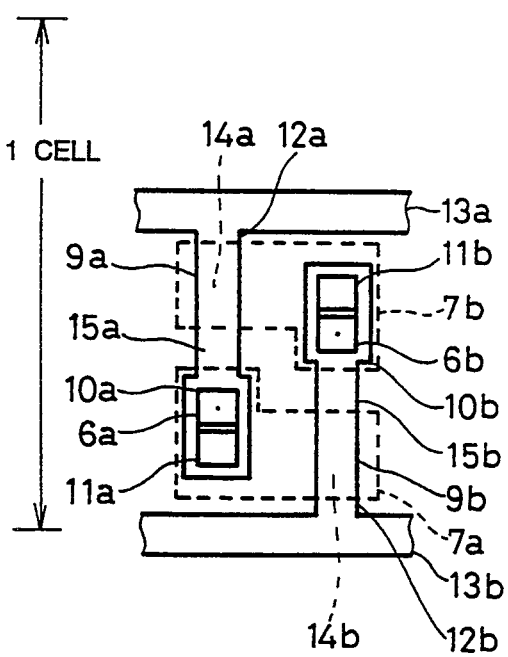
Figure 4:
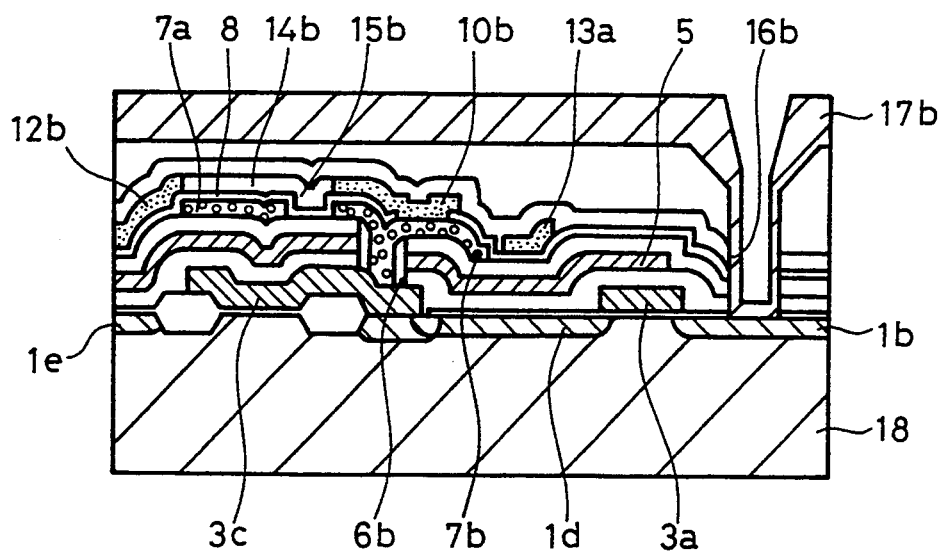
FIG. 4 is a sectional view taken along an A—A line in FIG. 3A.

FIGS. 3A and 3B are plan views of a CMOS-type SRAM of a first embodiment according to the invention. FIG. 3A shows impurity-diffused layer regions, MOS transistors, a grounding wiring layer, bit lines and contact holes for the bit lines, and FIG. 3B shows p-TFTs and power supply wiring layers. FIG. 4 is a sectional view taken along the line A—A in FIG. 3A.

As shown in FIG. 4, n-channel driver MOS transistors and n-channel transfer MOS transistors are formed on a p-well 18 in an n-type silicon substrate. Specifically, the transfer MOS transistors are composed of $n^+$-impurity regions 1a, 1b servings as drains, $n^+$-impurity regions 1c, 1d serving as sources, and a common gate electrode 3a, respectively. The driver MOS transistors are composed of $n^+$-impurity regions 1e, 1d serving as drains (1d also serving as the source of the transfer MOS transistor), an $n^+$-impurity region 1f serving as a common source, and gate electrodes 3b, 3c, respectively.

The gate electrodes 3b and 3c of the driver MOS transistors are cross-connected, through contact holes 2b and 2c, with the $n^+$-impurity regions 1e and 1d which are the drains of the paired transistors, respectively. The $n^+$-impurity region 1c is connected with the $n^+$-impurity region 1e through the contact hole 2a, the gate electrode 3b and also the contact hole 2b.

The drains 1a and 1b of the transfer MOS transistors are connected, through the contact holes 16a and 16b, with bit lines 17a and 17b which are aluminum (Al) interconnect wiring layers, respectively.

The common source 1f of the driver MOS transistors is connected, through a contact hole 4, with a grounding wiring layer 5 which is a second layer conductive film. This grounding layer is structured so as to cover the entire memory cell except the contact hole portions 16a, 16b, and the contact hole portions 6a, 6b for connecting the storage nodes 1e, 1d with the gate electrodes of p-TFTs.

The p-TFTs have a bottom gate structure. Specifically, their gate electrodes 7a and 7b are connected with the gate electrodes 3b and 3c of the driver MOS transistors through contact holes self-aligned for the contact hole portions 6a and 6b opened in the grounding wiring layer 5.

Formed on the gate electrodes 7a and 7b of the p-TFTs are semiconductor thin films 9a and 9b of amorphous silicon which constitute drain regions 10a, 10b, source regions 12a, 12b and channel regions 14a, 14b of the TFTs.

The semiconductor thin films 9a and 9b also constitute the grounding wiring layers 13a, 13b connected with the source regions 12a, 12b, and offset regions 15a, 15b formed between the drain regions 10a, 10b and the channel regions 14a, 14b to improve the cut-off characteristics of the TFTs.

The drain regions 10a, 10b of the TFTs are cross-connected, through the contact holes 11a and 11b, with the gate electrodes 7a and 7b of the paired transistors, respectively.

As described above, the grounding wiring layer 5 is so structured that it covers the entire memory cell except the predetermined portions as mentioned above, so that it provides low grounding impedance and also large electrostatic capacitances at the gate electrode 3a of the driver MOS transistors with respect to the grounding wiring layer 5 and the gate electrodes 7a, 7b of the TFTs with respect to the grounding wiring layer 5, hence, at the storage nodes 1e, 1d of the memory cell with respect to the grounding wiring layer 5. Further, the grounding wiring layer 5 is extended immediately below the offset regions 15a, 15b of the TFTs so as to electrically shield them. For this reason, a change in the potentials at the gate electrodes of the underlying driver MOS transistors will not influence on the off-currents of the TFTs.

Referring next to FIGS. 5A through 5D, an explanation will be given of the process for fabricating the CMOS-type SRAM cell according to the above described first embodiment of the invention.

First, a p-well is formed on the main surface of an n-type silicon substrate. A device-isolation region is formed on the p-well surface by the Local Oxidation of Silicon (LOCOS) method. The gate electrodes 3a and 3c of the transfer MOS transistor and the driver MOS transistor each having a polycide structure are formed on a gate insulating film 20.

Then, in order to cross-connect the gate electrodes and drain regions of the two driver MOS transistors, contact holes 2c are formed in advance at a predetermined area in the gate insulating film 20 prior to depositing polycide electrode material. In forming the gate electrode, phosphorus (P) is diffused through the contact hole 2c from the polycide to form an n-impurity diffused region 21.

The known steps of ion-injection and forming a sidewall 22 are executed to form n+-impurity regions 1b, 1d and 1f of a Lightly Doped Drain (LDD) structure. Subsequently, an interlayer insulating film 23 of an silicon dioxide film is deposited on the entire surface by the Low-Pressure Chemical Vapor Deposition (LPCVD) method and, then, a contact hole (not shown) exposing the surface of the source of the driver MOS transistors is formed by the photolithography method.

Figure 5A:
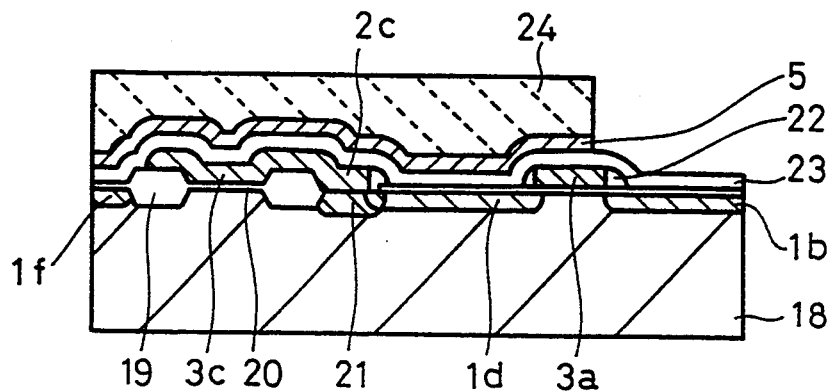
FIGS. 5A through 5D are sectional views showing the steps of the process for fabricating the CMOS-type SRAM cell of the first embodiment according to the present invention.

The second layer conductive film of WSix is deposited on the resultant surface. The bit line contact area of the memory cell portion is removed by etching using photoresist 24 as a mask to form a grounding wiring layer 5 (FIG. 5A). Then, the wiring layer of the peripheral circuits for the memory device is also formed.

Figure 5B:
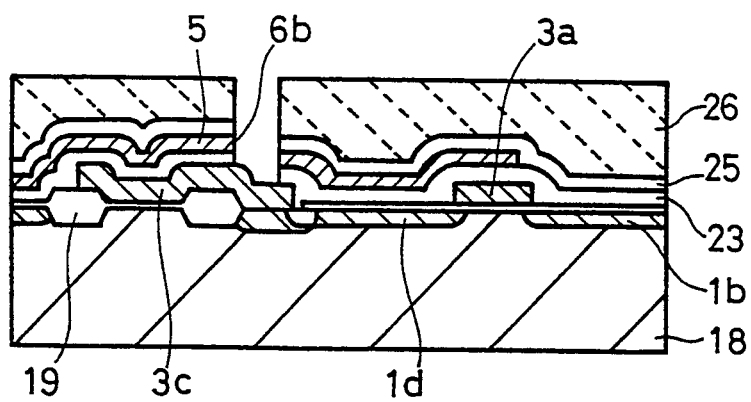

A silicon oxide film is deposited on the entire surface by the LPCVD method to form an interlayer insulating film 25. Photoresist 26 is applied to the insulating film 25 to define the area where a contact hole for connecting the bottom gate of the TFT with a memory cell storage node is to be formed. Three layers of the interlayer insulating film 25, the grounding wiring layer 5 and the interlayer insulating film 23 are removed by anisotropic etching using the photoresist 26 as a mask to form a contact hole portion 6b (FIG. 5B).

Figure 5C:
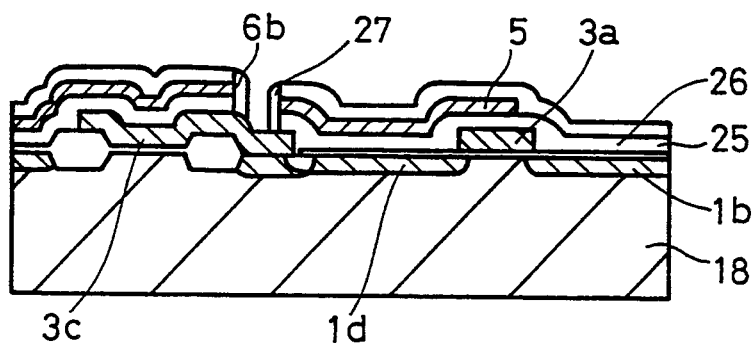

Subsequently, a silicon oxide film is deposited on the entire surface by the LPCVD method. It is etched back by the anisotropic etching to form a contact hole self-aligned for the pattern of the grounding wiring layer 5 with a side wall 27 of a silicon oxide film being left on the side wall portion of the contact hole portion 6b (FIG. 5C).

Then, a polycrystalline silicon layer is deposited on the surface and doped with n-type impurities. It is etched in a predetermined pattern to form the gate electrodes 7a and 7b of the load TFTs. The gate insulating film 8 of an silicon oxide film for the TFTs is deposited on the surface by the LPCVD method, and a contact hole for cross-connecting the gate electrode and the drain region of the p-TFTs is formed in it.

Thereafter, an amorphous silicon layer having a thickness of 800Å is deposited on the surface by the LPCVD method using monosilane at 520° C.

Thereafter, the substrate is annealed at the low temperature (about 600° C.) for a long time (8–96 hours) to further crystallize the amorphous silicon layer. In order to control the threshold voltage ($V_T$) of the p-TFT, the amorphous silicon layer is ion-implanted with phosphorus (P) at the dosage of $1 \times 10^{12} \sim 2 \times 10^{13}$ cm$^{-2}$. This semiconductor thin film is shaped into a pattern of the necessary source, channel and drain regions of the TFTs and the power source wiring layers by the known photo-etching technique.

Figure 5D:
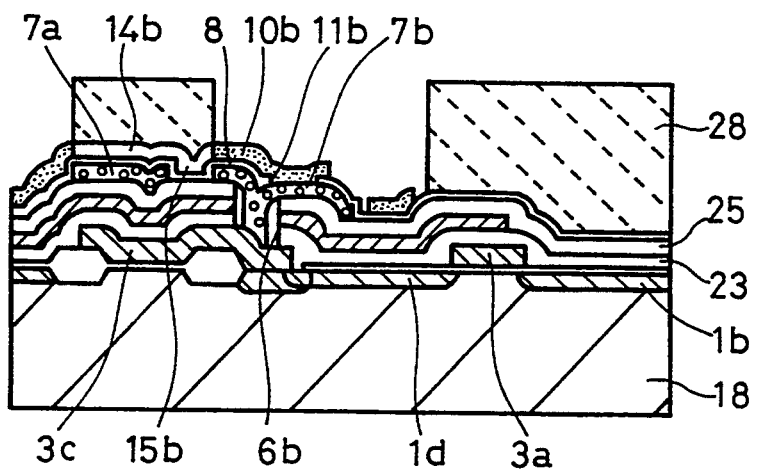

A photoresist film 28 is formed to dope selectively the source/drain regions of the p-TFTs and also the power source wiring layers with p-type impurities and, then, BF$_2$+ is ion-implanted through the photoresist film 28 at the acceleration energy of 30 keV and the dosage of $1 \times 10^{14} \sim 5 \times 10^{15}$ cm$^{-2}$. Then, an offset region 15b ranging from 0.3~0.6 μm in length which is not doped with p-type impurity is provided between the channel region 14b and the drain region 10b of the TFT, thereby improving the cut-off characteristics of the TFT (FIG. 5D).

Finally, a silicon oxide film and a BPSG film are deposited on the entire surface by the LPCVD method, and these films are subjected to reflow by the heat-treatment, thereby flattening the surface. A bit-line contact hole 16b for drawing a bit line is formed, and a bit line 17b made of Al is also formed. Thus, the device shown in FIG. 4 is completed.

Second Embodiment

Figure 6A:
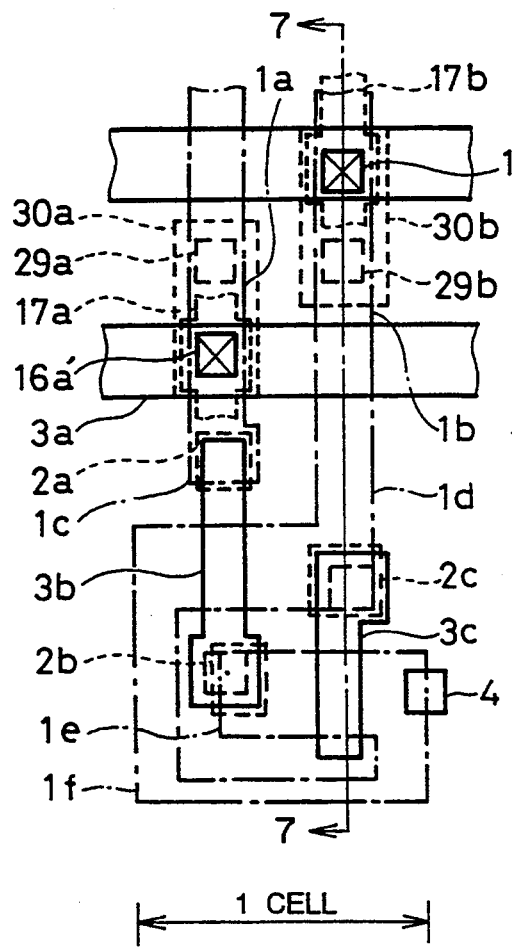
FIGS. 6A and 6B are plan views of a memory cell structure of a fully CMOS-type SRAM cell of a second embodiment according to the present invention.
Figure 6B:
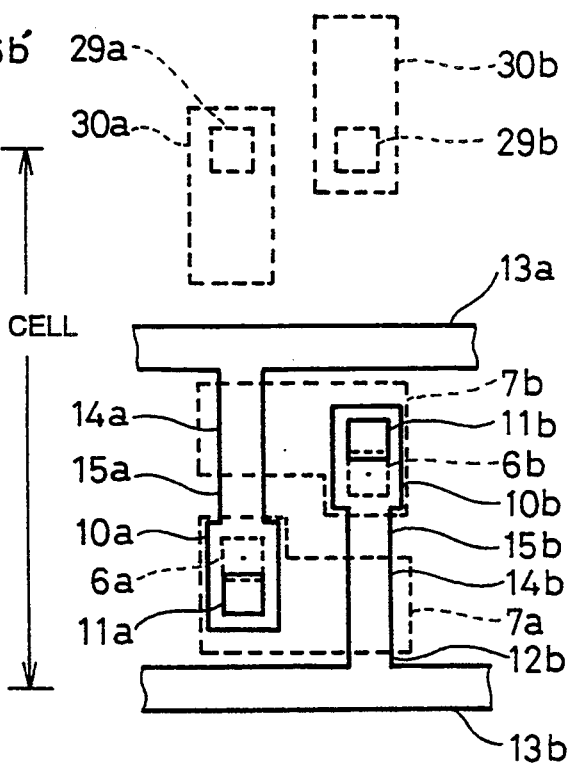
Figure 7:
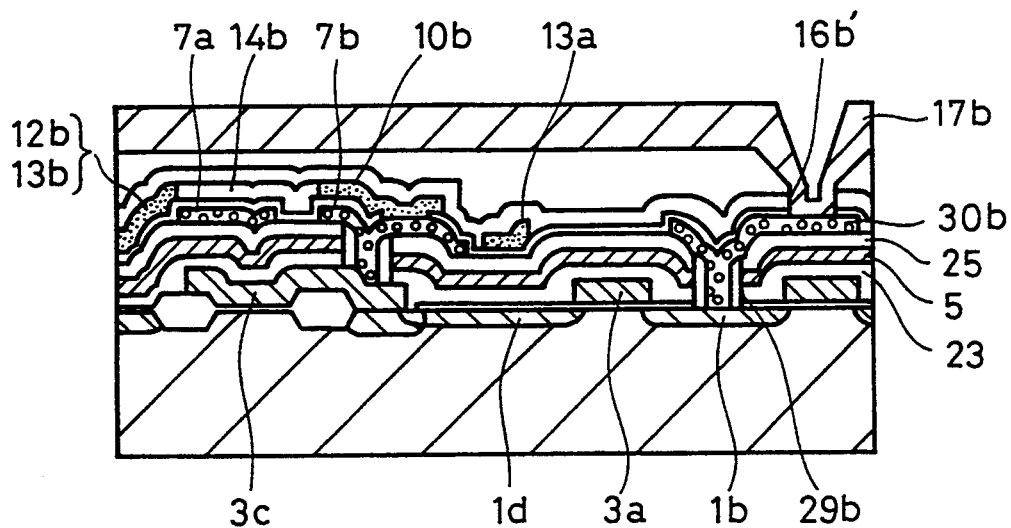
FIG. 7 is a sectional view taken along an A—A line in FIG. 6A.

FIGS. 6A and 6B are plan views of a CMOS-type SRAM of a second embodiment according to the invention. FIG. 7 is a sectional view taken along the line A—A in FIG. 6A.

The SRAM cell structure according to this second embodiment is different from that according to the first embodiment in that the grounding wiring layer 5 is extended onto the transfer MOS transistors and their drains are connected with the bit lines 17a, 17b through drawing electrodes 30a, 30b.

The drawing electrodes 30a and 30b are connected with the n+-impurity regions 1a and 1b, respectively, through the contact holes formed by providing side walls in contact hole portions 29a and 29b opened in the interlayer insulating films 23 and 25 and the grounding wiring layer 5 intervening between them, i.e., through the contact holes self-aligned for the holes in the grounding wiring layer 5. These contact hole portions 29a, 29b and the contact holes made thereat are formed simultaneously with the formation of the contact hole portions 6a, 6b for connecting the gate electrodes 7a, 7b of the p-TFTs with the underlying storage nodes and the contact holes made thereat. Thus, the drawing electrodes 30a and 30b are formed simultaneously with the formation of the gate electrodes 7a and 7b using the same semiconductor thin film.

The drawing electrodes 30a and 30b are connected with the bit lines 17a and 17b made of aluminum (Al) through the contact holes 16a' and 16b', respectively.

The structure described above is without a break or gap in the grounding wiring layer in the memory cell area, so that it can provide the grounding wiring with still lower impedance. This permits a more stabilized memory operation to be performed. Further, the adoption of the drawing electrodes contributes to the reduction in the steps at the bit line contact portions, thereby improving greatly the coverage of the Al interconnect wirings at the contact portions.

Although, in the two embodiments described above, the p-channel bottom gate type TFTs were used as load elements, the present invention should not be limited to it. The load may be a top gate type TFT or a dual gate type TFT in which the gate electrodes are provided above and below its channel region.

Further, a TFT with no offset region may be used in place of the TFT with an offset region as explained in connection with the above embodiments. The TFT in an LDD structure may be used in which the offset region is lightly doped with p-type impurities.

As described above, in accordance with the present invention, the contact holes for connecting the gate electrodes of load TFTs with storage nodes are formed in self-alignment for the holes opened in the grounding wiring layer, so that there is no break or gap of the grounding wiring layer over the substantially entire area of the memory cell area. Therefore, in accordance with the present invention, the memory cell can be supplied with the grounding potential with substantially low impedance, thus stabilizing the operation of the memory. This effect is particularly remarkable in advanced reduction in the size of the memory cell and in the operation of the memory cell at a low voltage.

The provision of the grounding wiring layer between the gate electrodes of tile MOS transistors formed on a substrate and the gate electrodes of the load TFTs can increase the capacitance of each of these gates with respect to the grounding (GND) layer and hence the capacitance of the storage nodes of the memory cell, thus improving or enhancing the resistance to software error caused by α-ray.

Further, the provision of the grounding wiring layer between the load TFTs and the driver MOS transistors restricts the influence of a change in the potentials at the gate electrodes of the underlying MOS transistors upon the off currents of the TFTs, thus stabilizing the operation of the TFT load type SRAM device.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A fully CMOS-type static random access memory device comprising;
   MOS transistors of a first conductivity type constituting driver transistors of a flip-flop type memory cell, formed on a main surface of a semiconductor substrate;
   MOS thin film transistors of a second conductivity type constituting load transistors of said flip-flop memory cell, formed on the main surface of said semiconductor substrate;
   a conductive thin film extending between said MOS transistors and said MOS thin film transistors, said conductive film being connected with a fixed potential power source and having holes opened in its contact hole portions for connecting said MOS transistors with said MOS thin film transistor; and
   transfer MOS transistors of said first conductivity type having sources connected with drains of said MOS transistors, drains connected with bit lines through drawing electrodes, and a common gate connected to a word line, formed on the main surface of said semiconductor substrate, wherein said conductive thin film extends on said transfer MOS transistors and has holes in its contact hole portions for connecting drains of said transfer MOS transistors and said drawing electrodes.

2. A fully CMOS-type static random access memory according to claim 1, in which each of said MOS thin film transistors of the second conductivity type has an offset region doped with no second conductivity impurity between its channel region and its drain region.

* * * * *